United States Patent
Benedict et al.

[11] Patent Number: 6,046,487
[45] Date of Patent: Apr. 4, 2000

[54] SHALLOW TRENCH ISOLATION WITH OXIDE-NITRIDE/OXYNITRIDE LINER

[75] Inventors: John Preston Benedict, New Paltz; David Mark Dobuzinsky, Hopewell Junction; Philip Lee Flaitz, Walden, all of N.Y.; Erwin N. Hammerl, Emmerting, Germany; Herbert Ho, New Windsor; James F. Moseman, Glenham, both of N.Y.; Herbert Palm, Hoehenkirchen, Germany; Seiko Yoshida, Yokohama, Japan; Hiroshi Takato, Wappingers Falls, N.Y.

[73] Assignee: International Business Machines Corporation, Armonk, N.Y.

[21] Appl. No.: 08/989,303

[22] Filed: Dec. 12, 1997

Related U.S. Application Data

[62] Division of application No. 08/790,266, Jan. 28, 1997, Pat. No. 5,763,315.

[51] Int. Cl.[7] .................................................. H01L 27/04

[52] U.S. Cl. ..................... 257/510; 257/639; 257/647; 257/649

[58] Field of Search ....................... 257/374, 397, 257/510, 513, 639, 647, 648, 649; 438/435, 437

[56] References Cited

U.S. PATENT DOCUMENTS

| | | | |
|---|---|---|---|
| 4,631,803 | 12/1986 | Hunter et al. | 29/576 W |
| 4,855,804 | 8/1989 | Bergami et al. | 257/639 X |
| 5,099,304 | 3/1992 | Takemura et al. | 357/49 |
| 5,189,501 | 2/1993 | Kawamura et al. | 257/647 |
| 5,190,889 | 3/1993 | Poon et al. | 437/67 |
| 5,206,182 | 4/1993 | Freeman | 437/33 |
| 5,384,280 | 1/1995 | Aoki et al. | 437/67 |
| 5,387,540 | 2/1995 | Poon et al. | 437/42 |
| 5,429,977 | 7/1995 | Lu et al. | 437/47 |
| 5,447,884 | 9/1995 | Fahey et al. | 437/67 |
| 5,492,858 | 2/1996 | Bose et al. | 437/67 |
| 5,747,866 | 5/1998 | Ho et al. | 257/506 |
| 5,780,346 | 7/1998 | Arghavani et al. | 438/296 |
| 5,811,347 | 9/1998 | Gardner et al. | 438/435 |

OTHER PUBLICATIONS

M. R. Poponiak and P. J. Tsang, "Formation of Thick $Si_3N_4$ or $Si_xO_yN_z$ On Substrate By Anodnitridization", IBM Technical Disclosure Bulletin, vol. 19, No. 03, Aug. 1976, p. 905.

*Primary Examiner*—John Guay
*Attorney, Agent, or Firm*—Ira D. Blecker

[57] ABSTRACT

Disclosed is an improved process and liner for trench isolation which includes either a single oxynitride layer or a dual oxynitride (or oxide)/nitride layer. Such a process and liner has an improved process window as well as being an effective $O_2$ diffusion barrier and resistant to hot phosphoric and hydrofluoric acids.

4 Claims, 2 Drawing Sheets

SHALLOW TRENCH ISOLATION WITH OXIDE-NITRIDE/OXYNITRIDE LINER

This is a division of application Ser. No. 08/790,226, filed Jan. 28, 1997, now U.S. Pat. No. 5,763,315.

BACKGROUND OF THE INVENTION

This invention relates to the field of trench isolation integrated circuit processing, and more particularly, to the processing of trench isolation structures.

Trench isolation has been used in the semiconductor industry to reduce circuit topography and better isolate adjacent semiconductor devices. Various proposals have been made for improving the liner in trench isolation structures. Fahey et al. U.S. Pat. No. 5,447,884, the disclosure of which is incorporated by reference herein, discloses a nitride liner with an optional thermal oxide layer for shallow trench isolation. Kawamura et al. U.S. Pat. No. 5,189,501, Poon et al. U.S. Pat. No. 5,190,889, Takemura et al. U.S. Pat. No. 5,099,304, Freeman U.S. Pat. No. 5,206,182, Hunter et al. U.S. Pat. No. 4,631,803 and Aoki et al. U.S. Pat. No. 5,384,280, the disclosures of which are incorporated by reference herein, disclose similar structures of a silicon dioxide (thermal oxide) layer followed by a silicon nitride layer for trench isolation.

Hunter et al. U.S. Pat. No. 4,631,803 additionally discloses a second oxide layer deposited over the nitride layer and a second nitride layer deposited over the second oxide layer.

Poponiak et al. IBM Technical Disclosure Bulletin, 19, No. 3, p. 905 (August 1976), the disclosure of which is incorporated by reference herein, discloses an anodization process for producing surface films of silicon oxynitride for dielectric isolation.

A silicon nitride liner has shown to be a highly effective $O_2$ diffusion barrier. The silicon nitride liner limits the amount of oxide that can be grown in deep trenches as well as in shallow trench structures, and as such, all but eliminates silicon crystal defects from forming within the trench capacitor array. However, there are two problems with the as-deposited silicon nitride liner. First, the as-deposited silicon nitride liner has been shown to be a source of charge-trapping which leads to unacceptable levels of junction leakage in the support circuitry. Recent studies indicate that a majority of the charge-trapping occurs at the interface of the silicon nitride liner and the deposited oxide that is used to fill the trenches. Second, the process window for the silicon nitride liner is extremely narrow. If the liner is deposited equal to or less than 4 nm in thickness, the liner is not an effective $O_2$ diffusion barrier and defects are readily formed in the trench capacitor array. If the liner thickness is greater than 5 nm, the liner is prone to attack by the hot phosphoric acid that is used to strip the pad nitride film from the silicon surface. A divot forms in the silicon nitride liner and oxide filler which may trap polysilicon (used as part of the gate conductor), metals or foreign material. A divot is an undercutting of the trench liner and oxide filler as a result of attack of the trench line by the hot phosphoric acid. Any of the aforementioned materials may lead to electrical shorts of devices.

Accordingly, it is a purpose of the present invention to have an improved liner material that is an effective $O_2$ diffusion barrier, is resistant to hot phosphoric and other acids (e.g., hydrofluoric acid) and shows a reduced trap density.

BRIEF SUMMARY OF THE INVENTION

This and other purposes of the invention have been achieved by providing, according to a first aspect of the invention a method of forming isolation members embedded in a silicon layer of an integrated circuit, the method comprising the steps of:

depositing a protective layer containing at least one layer of nitride on an exposed surface of a silicon layer;

etching through said protective layer to form at least one isolation mask aperture;

etching through said at least one isolation mask aperture to form at least one isolation trench;

forming a conformal layer in said at least one isolation trench and on said protective nitride layer, said conformal layer selected from the group consisting of an oxynitride, a dual layer of an oxide plus a nitride and a dual layer of an oxynitride plus a nitride;

depositing a CVD layer of oxide filler over said conformal layer and having a thickness sufficient to fill said at least one isolation trench;

stripping said protective nitride layer and that portion of said conformal layer that is on said protective nitride layer.

According to a second aspect of the invention there is provided an isolation member embedded in a silicon layer of an integrated circuit comprising:

a silicon layer on a substrate having at least one isolation trench;

a conformal layer in said at least one isolation trench, said conformal layer selected from the group consisting of an oxynitride, a dual layer of an oxynitride plus a nitride and a dual layer of an oxide plus a nitride;

an oxide filler over said conformal layer and having a thickness sufficient to fill said at least one isolation trench.

DETAILED DESCRIPTION OF THE INVENTION

The present inventors have proposed an improved liner which comprises either a single oxynitride layer or a dual oxynitride (or oxide)/nitride layer. Such a liner has an improved process window as well as being an effective $O_2$ diffusion barrier and resistant to hot phosphoric and hydrofluoric acids.

Figure 1A:
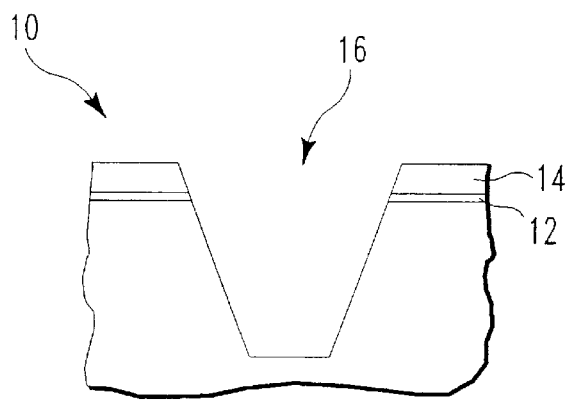
FIGS. 1A to 1F show a trench, according to one embodiment of the invention, in the various stages of formation.

Referring to the FIGS. 1A to 1F in more detail, and particularly referring to FIG. 1A, there is shown a first embodiment of the present invention. A portion of a substrate (or epitaxial layer) generally indicated by 10, is shown in FIG. 1A having a conventional pad oxide layer 12 of thickness about 8 nm and a conventional pad nitride layer 14 of thickness about 220 nm. A conventional reactive ion etching process ($CF_4$——$CHF_3$——Ar) has cut through the pad oxide liner 12 and pad nitride layer 14 and cut isolation trenches 16 to an illustrative depth of about 0.1 to 1 microns, usually about 0.25 microns.

Figure 1B:
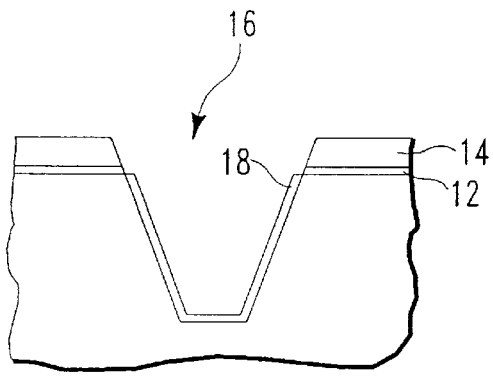

As shown in FIG. 1B, a thermal oxidation step has produced a thin layer 18 of thermal oxide ($SiO_2$) having a nominal thickness of about 10 nm to stabilize the surface. While preferred, the thermal oxidation layer is optional.

A problem that has been encountered in the prior art is that when pad nitride layer 14 is stripped in a conventional stripping process using hot phosphoric acid, the phosphoric acid penetrates down along the trench liner and produces a recess. Such a recess is unacceptable because it exposes the oxide filler (22 in FIG. 1D) in the trench and the thermal oxide liner 18 to attack in subsequent etching steps.

The nitride liner in the above discussed prior art goes a long way to solve this problem. But, of critical importance to the nitride liner is the small process window for deposition of nitride liner. If the nitride liner is too thin, it is not an effective $O_2$ diffusion barrier. If the nitride liner is too thick, it is subject to attack by the hot phosphoric acid. The difference between being too thick or too thin is on the order of 1 nm, a very small process window.

Figure 1C:
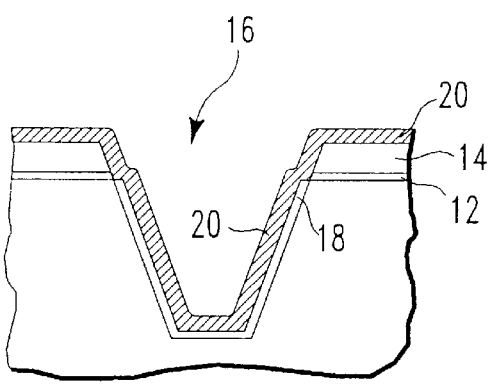

Referring now to FIG. 1C, a thin oxynitride film 20 ($SiO_xN_y$) with a thickness of about 5 to 15 nm is deposited over the optional thermal oxide liner 18 and pad nitride layer 14. Typical deposition conditions are a deposition temperature of 770 degrees Centigrade for about 5–10 minutes, a pressure of 175 mtorr, a dichlorosilane (DCS) flow of 30 cc, the ratio of $N_2O$:DCS being 3:1 to 5:1, and the ratio of $NH_3$:DCS being 3:1 to 5:1. Those skilled in the art will readily be able to vary these parameters to suit their circumstances.

Figure 1D:
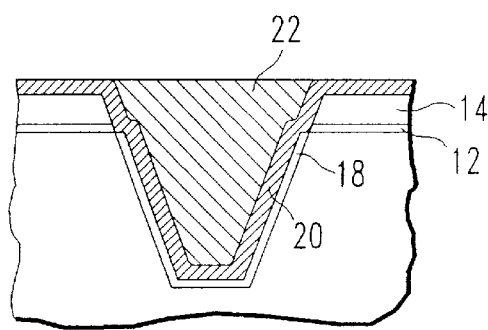

Referring now to FIG. 1D, there is shown an oxide filler 22 after deposition of 450–500 nm of TEOS (tetraethylorthosilicate) oxide and a step of annealing and densifying the oxide. The densification step is conducted as a pyrogenic oxidation anneal (wet oxidation, meaning an anneal during oxidation conditions) at a temperature of about 900 degrees Centigrade. At this temperature, the result of the wet oxidation anneal is comparable in densification of the oxide filler 22 to the results of a conventional annealing step at about 1000 degrees Centigrade. The etch resistance in phosphoric acid is believed to be better than an oxide annealed in argon.

Figure 1E:
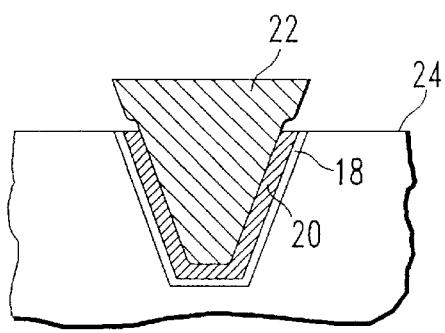

Referring now to FIG. 1E, the same trench 16 is shown after the pad nitride layer 14 and pad oxide layer 12 have been stripped. The oxynitride liner 20 is shown as flush with the substrate surface 24.

Figure 1F:
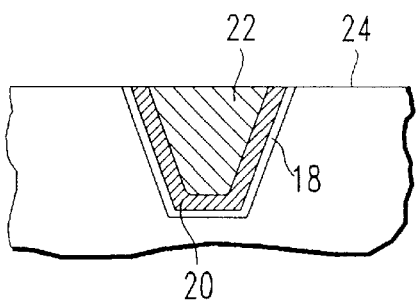

Lastly, the oxide filler 22 is planarized, for example by a suitable chemical-mechanical polishing process, so that the oxide filler 22 is flush with surface 24 of substrate 10. The resulting structure is shown in FIG. 1F.

Figure 2A:
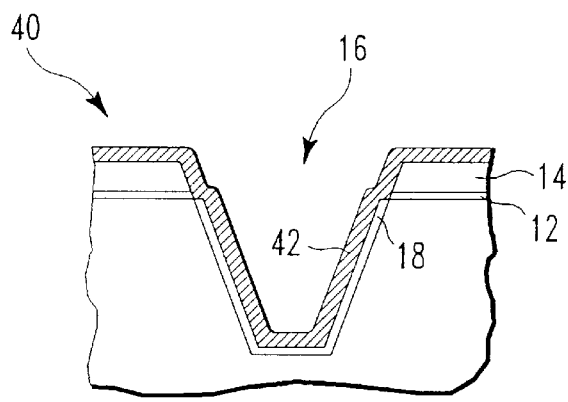
FIGS. 2A to 2E show a trench, according to a second embodiment of the invention, in the various stages of formation.

A second embodiment of the invention is illustrated in FIGS. 2A to 2E. The first two steps of the second embodiment according to the present invention are identical to that shown in FIGS. 1A and 1B and so will not be further discussed here. After the optional thermal oxide liner 18 is deposited, a silicon nitride ($Si_3N_4$) layer 42 is deposited by an LPCVD process on substrate 40 as is well known to those skilled in the art. The thickness of the silicon nitride layer 42 should be about 5 to 10 nm. The silicon nitride layer 42 is amorphous in nature. As illustrated in FIG. 2A, the silicon nitride layer 42 covers thermal oxide liner 18 and pad nitride layer 14.

Figure 2B:
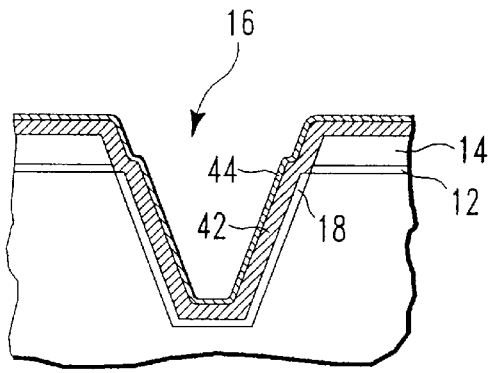
Figure 2D:
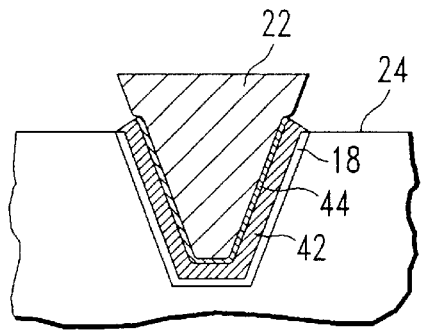
Figure 2C:
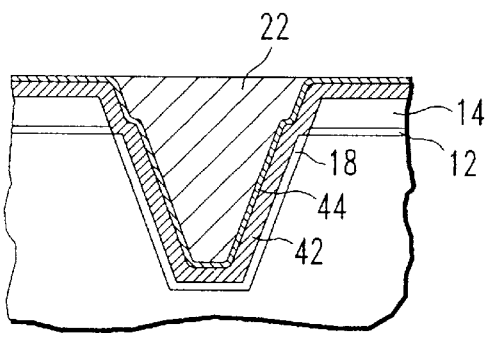

After deposition of silicon nitride layer 42, an oxide or oxynitride film 44 is formed by oxidizing the silicon nitride layer 42 (FIG. 2B). The oxide or oxynitride film 44 may be formed either by furnace annealing in wet hydrogen at a temperature of at least 900 degrees Centigrade for about 10 minutes or by rapid thermal oxidation (RTO) in pure oxygen at temperatures of about 1100 degrees Centigrade for 40–80 seconds. The oxidation consumes about 25% of the thickness of the silicon nitride layer. The precise composition of the oxide or oxynitride film 44 is unknown. The oxide film formed may be $SiO_2$ or $Si_2N_2O$ but the purposes and advantages of the invention do not depend on the precise composition formed as it has been found that oxidation of the silicon nitride layer 42 according to the parameters above produces an efficacious film.

It has been found that for an oxynitride/silicon nitride composite layer (samples of the composite layer were formed by RTO at 1100 degrees centigrade in pure oxygen for 40, 60 and 80 seconds) exposed to hot phosphoric acid for 100 seconds (typical etch time for a wafer to remove the pad nitride layer and pad oxide layer), there was no decrease in thickness of the composite layer. This should be compared to an as-deposited silicon nitride layer which typically etches 5.5–6 nm per minute in hot phosphoric acid.

Figure 2E:
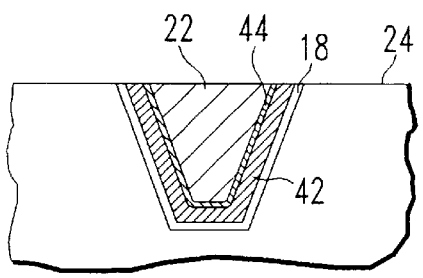

The process continues with deposition of an oxide filler 22 (FIG. 2C), stripping of the pad nitride layer 14 and pad oxide layer 12 (FIG. 2D) and planarization of the oxide filler 22 to result in the structure shown in FIG. 2E. These process steps correspond to those process steps discussed previously in conjunction with FIGS. 1D, 1E and 1F.

As a result of the improved liner materials, the process window for forming shallow trenches has been improved.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An isolation member embedded in a silicon layer of an integrated circuit comprising:

a silicon layer on a substrate having at least one isolation trench;

a conformal layer in said at least one isolation trench, said conformal layer consisting of a first layer of silicon nitride followed by a second layer of silicon oxide and has a thickness of 5 to 10 nm.; and an oxide filler over said conformal layer and having a thickness sufficient to fill said at least one isolation trench.

2. The isolation member of claim 1 further comprising a thermal oxide layer between said conformal layer and said trench.

3. An isolation member embedded in a silicon layer of an integrated circuit comprising:

a silicon layer on a substrate having at least one isolation trench;

a conformal layer in said at least one isolation trench, said conformal layer consisting of a first layer of silicon nitride followed by a second layer of silicon oxynitride and has a thickness of 5 to 10 nm.; and an oxide filler over said conformal layer and having a thickness sufficient to fill said at least one isolation trench.

4. The isolation member of claim 3 further comprising a thermal oxide layer between said conformal layer and said trench.

* * * * *